(12) United States Patent
Zhang et al.

(10) Patent No.: US 9,978,570 B2
(45) Date of Patent: May 22, 2018

(54) REACTION CHAMBER AND SEMI-CONDUCTOR PROCESSING DEVICE

(71) Applicant: BEIJING NMC CO., LTD., Beijing (CN)

(72) Inventors: Yanzhao Zhang, Beijing (CN); Qing She, Beijing (CN); Peng Chen, Beijing (CN)

(73) Assignee: BEIJING NAURA MICROELECTRONICS EQUIPMENT, Beijing (CN)

( * ) Notice: Subject to any disclaimer, the term of this patent is extended or adjusted under 35 U.S.C. 154(b) by 0 days. days.

(21) Appl. No.: 15/310,047

(22) PCT Filed: Nov. 27, 2014

(86) PCT No.: PCT/CN2014/092368
§ 371 (c)(1),
(2) Date: Nov. 9, 2016

(87) PCT Pub. No.: WO2015/172549
PCT Pub. Date: Nov. 19, 2015

(65) Prior Publication Data
US 2017/0154758 A1 Jun. 1, 2017

(30) Foreign Application Priority Data

May 13, 2014 (CN) .......................... 2014 1 0202122

(51) Int. Cl.
*C23C 14/35* (2006.01)
*H01J 37/34* (2006.01)
(Continued)

(52) U.S. Cl.
CPC .......... *H01J 37/3441* (2013.01); *C23C 14/14* (2013.01); *C23C 14/35* (2013.01);
(Continued)

(58) Field of Classification Search
CPC ....... C23C 14/14; C23C 14/35; C23C 14/564; H01J 37/32651; H01J 37/3405; H01J 37/3441; H01L 21/00; H01L 21/2855
(Continued)

(56) References Cited

U.S. PATENT DOCUMENTS 5,948,215 A 9/1999 Lantsman
6,117,279 A 9/2000 Smolanoff et al.
(Continued)

FOREIGN PATENT DOCUMENTS

CN 1265222 8/2000
CN 1301880 7/2001
(Continued)

OTHER PUBLICATIONS

Search report A dated Feb. 17, 2015.
Search Report B dated Aug. 24, 2015.

*Primary Examiner* — Rodney G McDonald
(74) *Attorney, Agent, or Firm* — IPSILON USA, LLP (57) ABSTRACT

A reaction chamber and a semiconductor processing device, comprise a Faraday shielding ring (21) made of a magnetic insulation material and an insulating ring (22) made of an insulating material; the Faraday shielding ring (21) is provided with a slot thereon passing through a ring surface thereof in an axial direction; both the Faraday shielding ring (21) and the insulating ring (22) are disposed in the reaction chamber surrounding an inner peripheral wall of the reaction chamber, and the Faraday shielding ring (21) is stacked on the insulating ring (22) in a vertical direction. A shielding ring (211) is disposed surrounding an inner peripheral wall of the insulating ring (22), the shielding ring (211) is connected to an area of a lower surface of the Faraday shielding ring (21) adjacent to a center of the reaction chamber, and the shielding ring (211) is made of a magnetic insulation material and provided with a slot thereon passing (Continued)

through a ring surface thereof in an axis direction. The reaction chamber and the semiconductor processing device can not only avoid or reduce the risk of sparking, but also reduce the pollution of the reaction chamber caused by the flaking off of metal particles; and in addition, it is possible to increase an inner diameter and an available space of the reaction chamber.

12 Claims, 5 Drawing Sheets

(51) Int. Cl.
  *C23C 14/14* (2006.01)
  *H01J 37/32* (2006.01)
  *H01L 21/285* (2006.01)
(52) U.S. Cl.
  CPC .... *H01J 37/32651* (2013.01); *H01J 37/3405* (2013.01); *H01L 21/2855* (2013.01)

(58) Field of Classification Search
  USPC .............. 204/298.11; 118/723 I, 723 IR; 156/345.48, 345.49
  See application file for complete search history.

(56) References Cited

U.S. PATENT DOCUMENTS

| | | | |
|---|---|---|---|
| 6,398,929 B1* | 6/2002 | Chiang | C23C 14/046 204/298.11 |
| 6,846,396 B2 | 1/2005 | Perrin | |
| 2012/0273130 A1* | 11/2012 | Drewery | H01J 37/32651 156/345.3 |
| 2013/0256129 A1* | 10/2013 | Chen | H01J 37/32467 204/298.11 |

FOREIGN PATENT DOCUMENTS

| | | |
|---|---|---|
| CN | 1610766 | 4/2005 |
| CN | 102418073 | 4/2012 |

\* cited by examiner

REACTION CHAMBER AND SEMI-CONDUCTOR PROCESSING DEVICE

This application is a National Phase of PCT/CN2015/092368, filed on Nov. 27, 2014 which in turn claims the benefit of priority from Chinese Application No. 2014-10202122.9, filed on May 13, 2014, the entirety of which are incorporated by reference.

TECHNICAL FIELD

The present invention belongs to the field of semiconductor device manufacturing technology, and particularly relates to a reaction chamber and a semiconductor processing device.

BACKGROUND

As a widely-used processing apparatus, a magnetron sputtering apparatus is mainly used in deposition process of a work piece such as a substrate. The basic principle of the magnetron sputtering is as follows: a reaction gas is excited to form plasma, which is used for bombarding a target material disposed in a reaction chamber, such that particles escape from a surface of the target material and then are deposited on a work piece. In fabrication of semiconductor devices of very large-scale integration, a metal layer is generally required to be deposited in a channel, trench or via having a large depth-to-width ratio on a surface of a work piece, and thus concentration of the plasma is required to be increased in the reaction chamber.

Figure 1:
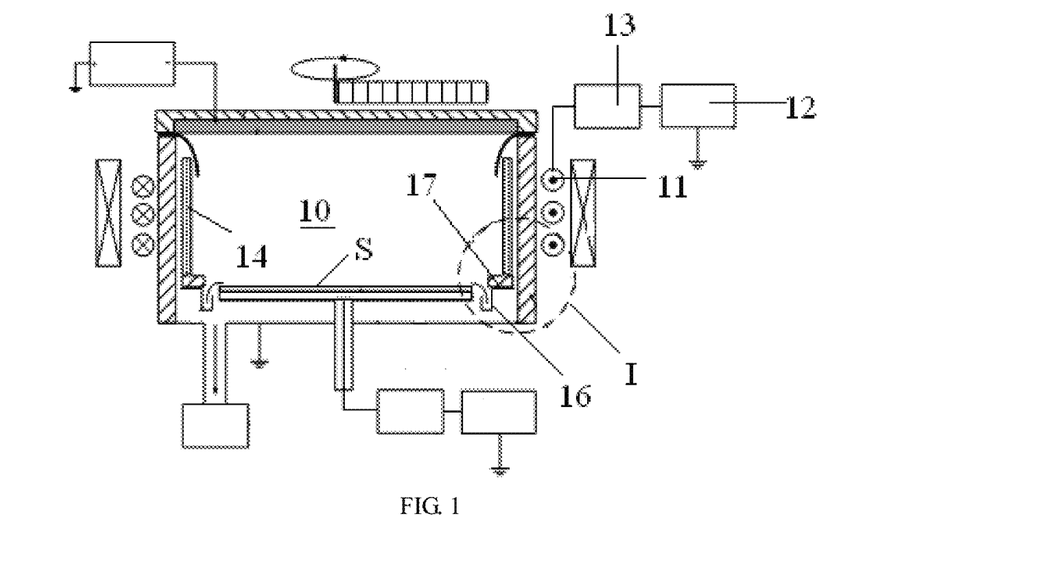
FIG. 1 is a structural schematic diagram of an reaction chamber in prior art.
Figure 2A:
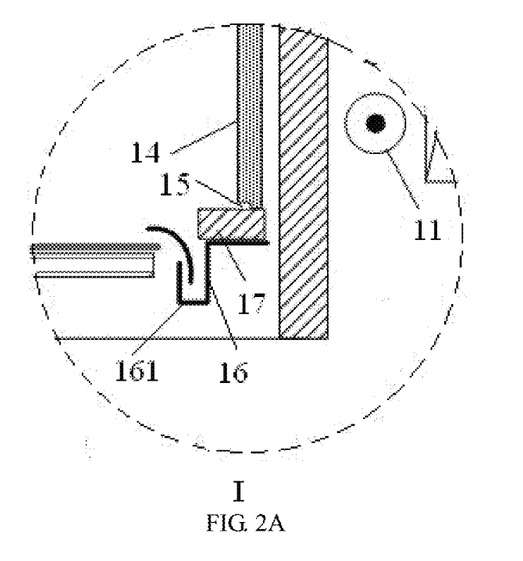
FIG. 2A is a partially enlarged view of a region I in FIG. 1.

Referring to FIGS. 1 and 2A, an existing reaction chamber is illustrated. The reaction chamber 10 is provided with an induction coil 11 surrounding outer sides of side walls thereof, which is electrically connected with a radio frequency (RF) power supply 12 via a matcher 13 and configured to generate an alternating magnetic field in the reaction chamber 10, such that a processing gas in the reaction chamber 10 is excited by energy of the alternating magnetic field to form plasma. In practical processes, a metal film may be deposited on the inner side walls of the reaction chamber 10 while depositing a metal film on a work piece S, that is, a closed metal ring is nested on the inner side walls, which will lead to an induced current generated in the metal ring by the alternating magnetic field generated from the induction coil 11, so that the alternating magnetic field generated from the induction coil 11 is shielded. For this reason, the reaction chamber 10 is generally provided with a Faraday shielding ring 14 having a cylindrical structure, which surrounds the inner side walls of the reaction chamber 10. The Faraday shielding ring 14 is made of a magnetic insulation material and provided with a slot (not shown in the figures) thereon at the ring surface thereof, which passes through the ring surface thereof in an axial direction, so that the Faraday shielding ring 14 is unclosed in its circumferential direction.

Figure 2B:
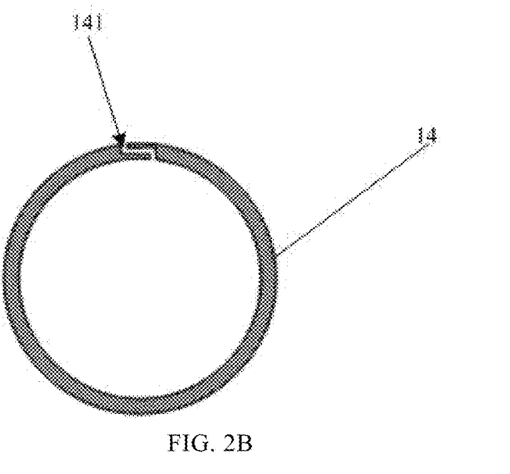
FIG. 2B is a plan view of a conventional Faraday shielding ring.

Referring to FIG. 2B, a plan view of a conventional Faraday shielding ring is illustrated. The Faraday shielding ring 14 is of a cylindrical structure and unclosed in its circumferential direction. Specifically, a slot is provided at the ring surface of the Faraday shielding ring 14, which passes through the Faraday shielding ring 14 along an axial direction of the Faraday shielding ring 14. The slot is provided as a teeth-shaped slot 141. The so-called teeth-shaped slot 141 refers to that a projection of the slot 141 on a plane perpendicular to the axial direction of the Faraday shielding ring 14 appears as a shape similar to the character "Z". That is, a portion of the projection of the slot 141 facing the inner side of the reaction chamber 10 and a portion of the projection of the slot 141 distal to the inner side of the reaction chamber 10 are similar to a pair of teeth-shaped protrusions. The Faraday shielding ring 14 having the "Z" type teeth-shaped slot 141 is also referred to as a "Labyrinth Slot Faraday Shielding Ring". By employing such an unclosed Faraday shielding ring 14, a metal film can be prevented from being deposited and formed on the inner side walls of the reaction chamber 10, and a conductive path can be prevented from being formed in the Faraday shielding ring 14, so that energy of the alternating magnetic field generated from the induction coil 11 can be coupled into the reaction chamber 10.

In addition, at the bottom area of the reaction chamber 10, a lining member 16, which is generally made of a metal material and grounded, is provided surrounding the inner side walls of the reaction chamber 10. The lining member 16 is of a stepped shape, in which an upper step surface of the lining member 16 is a plane, and a lower step surface thereof is a bottom 161 of a recess of the lining member. An insulating ring 17, made of an insulating material such as quartz or ceramic, is stacked on the upper surface of the lining member 16, and a lower surface of the Faraday shielding ring 14 is stacked on an upper surface of the insulating ring 17. In order to prevent the Faraday shielding ring 14 from being closed at the slotted position of its lower surface when depositing metal particles on the upper surface of the insulating ring 17 in a process, a lower end of the Faraday shielding ring 14 is set to have a stepped shape, that is, an inner area of the lower surface of the Faraday shielding ring 14, which is adjacent to the center of the reaction chamber 10, is formed as a recess 15 that is recessed towards the upper surface of the Faraday shielding ring 14. Moreover, in order to prevent the slot of the Faraday shielding ring 14 from being closed, it is required that the dimension of the recess 15 in a horizontal direction is relatively large, that is, it is required that a thickness of the Faraday shielding ring 14 is relatively large in its radial direction.

In practical applications, the reaction chamber 10 as described above inevitably experiences the following problems. In a case where an up-to-down exhausting manner is employed in the reaction chamber 10, a majority of metal particles move downwards in a vertical direction. In this case, as the insulating ring 17 is stacked between the Faraday shielding ring 14 and the lining member 16, and an inner circumferential surface, a portion of the upper surface and a portion of the lower surface of the insulating ring 17 are exposed to the interior of the reaction chamber 10, metal particles are easily deposited on the upper surface of the insulating ring 17 when the process proceeds, causing that the Faraday shielding ring 14 becomes closed at the slotted position of its lower surface, and thus a spark phenomenon occurs at the slotted position and the process is affected. Further, as the inner circumferential surface, the portion of the upper surface and the portion of the lower surface of the insulating ring 17 are exposed to the interior of the reaction chamber 10, when metal particles deposited thereon flake off, the reaction chamber 10 is easily polluted by the particles, which may damage the work piece S severely.

SUMMARY

The present invention aims to solve the technical problems existing in the prior art, and provides a reaction chamber and a semiconductor processing device, which can not only reduce the risk of sparking in the reaction chamber and improve processing stability and processing quality, but also reduce the pollution of the reaction chamber caused by the flaking off of metal particles and thus reduce damages on the work piece.

To solve the above technical problems, the present invention provides a reaction chamber, comprising a Faraday shielding ring made of a magnetic insulation material and an insulating ring made of an insulating material, the Faraday shielding ring being provided with a slot thereon passing through a ring surface thereof in an axial direction, both the Faraday shielding ring and the insulating ring being disposed in the reaction chamber surrounding an inner peripheral wall of the reaction chamber, and the Faraday shielding ring being stacked on the insulating ring in a vertical direction, wherein, a shielding ring is disposed surrounding an inner peripheral wall of the insulating ring, the shielding ring is connected to an area of a lower surface of the Faraday shielding ring adjacent to a center of the reaction chamber, and the shielding ring is made of a magnetic insulation material and provided with a slot thereon passing through a ring surface thereof in an axis direction.

Optionally, a projection of the slot of the shielding ring coincides with a projection of the slot of the Faraday shielding ring on a plane perpendicular to a central axis of the reaction chamber.

Optionally, the shielding ring and the Faraday shielding ring are coaxially disposed and inner diameters thereof are identical.

Optionally, a horizontal spacing in a horizontal direction exists between an outer peripheral wall of the shielding ring and the inner peripheral wall of the insulating ring.

Optionally, the horizontal spacing is ranged from 1 mm to 2 mm.

Optionally, an edge area of the lower surface of the Faraday shielding ring distal to the center of the reaction chamber is provided with a protrusion protruding downwards and the protrusion contacts an upper surface of the insulating ring, so that the Faraday shielding ring is stacked on the upper surface of the insulating ring.

Optionally, the upper surface and/or the inner peripheral wall of the insulating ring and/or an inner peripheral wall of the Faraday shielding ring and/or an inner peripheral wall of the shielding ring are treated by a roughening process.

Optionally, the reaction chamber provided by the present invention further comprises a lining member which is disposed surrounding the inner peripheral wall of the reaction chamber at a bottom area of the reaction chamber, wherein a longitudinal section of the lining member is of a stepped shape, and the insulating ring is stacked on an upper step surface of the lining member.

Optionally, an inner diameter of the shielding ring is larger than an inner diameter of the upper step surface of the lining member, and a lower surface of the shielding ring is higher than a lower surface of the insulating ring, such that the shielding ring does not contact the upper step surface of the lining member.

Optionally, an outer diameter of the shielding ring is smaller than an inner diameter of the upper step surface of the lining member, and a lower surface of the shielding ring and a lower surface of the insulating ring are in a same horizontal plane.

Optionally, the shielding ring and the Faraday shielding ring are integrally formed.

As another technical solution, the present invention further provides a semiconductor processing device, comprising any one of the above-described reaction chambers.

The present invention has the following beneficial effects.

In the reaction chamber provided by the present invention, the shielding ring vertically extending downwards is provided in an area of the lower surface of the Faraday shielding ring adjacent to the center of the reaction chamber, and the shielding ring is also made of a magnetic insulation material and provided with a slot thereon passing through the ring surface thereof in an axial direction. The shielding ring is provided surrounding the inner side of inner peripheral wall of the insulating ring, so as to cover the inner peripheral wall of the insulating ring. In this way, when metal particles move downwards in the reaction chamber, the metal particles will be deposited on the shielding ring, thereby largely reducing or even avoiding the deposition of the metal particles on the insulating ring. Moreover, when the gas is discharged out of the reaction chamber from up to down, a majority of metal particles will move downwards in a vertical direction due to the fact that the surfaces of the Faraday shielding ring and the shielding ring exposed to the interior of the reaction chamber are vertical planes rather than horizontal planes, that is, a movement direction of the majority of metal particles is parallel with the inner peripheral walls of the Faraday shielding ring and the shielding ring facing the center of the reaction chamber, causing that the metal particles are unlikely to be deposited on the Faraday shielding ring and the shielding ring. In this way, the Faraday shielding ring and the shielding ring are prevented from being closed at the slotted positions, the risk of sparking is reduced, and the processing stability and the processing quality are improved; moreover, the pollution of the reaction chamber caused by the flaking off of metal particles is reduced as the deposition of the metal particles is reduced, thereby it is possible to reduce damages on a work piece.

The semiconductor processing device provided by the present invention adopts the reaction chamber provided by the other technical solution of the present invention, so that not only the risk of sparking in the reaction chamber can be reduced, and thus the processing stability and the processing quality are improved, but also the pollution of the reaction chamber caused by the flaking off of metal particles can be reduced, and thus damages on a substrate can be reduced.

DETAILED DESCRIPTION

To make those skilled in the art better understand the technical solutions of the present invention, the reaction chamber and the semiconductor processing device provided by the present invention will be described below in detail in conjunction with the accompanying drawings. Examples of the embodiments are illustrated in the accompanying drawings, throughout which the same or similar reference numerals refer to the same or similar components or components having the same or similar functions. The following embodiments described with reference to the accompanying drawings are exemplary embodiments and only used for explaining the present invention, and not construed as limitations on the present invention.

In description of the present invention, it should be understood that orientation or position relationships indicated by terms such as "upper", "lower", "bottom", "inner" and "outer" are based on orientation or position relationships illustrated in the drawings and only used for facilitating description of the present invention and simplifying the description, without indicating or implying that the indicated devices or components must have a specific orientation or be configured or operated in a specific orientation, and therefore it should not be construed as limitations on the present invention. In addition, the term of "thickness of a Faraday shielding ring" refers to a wall thickness of the Faraday shielding ring in a horizontal direction, that is, a difference between outer and inner diameters of the Faraday shielding ring; the term of "thickness of an insulating ring" refers to a wall thickness of the insulating ring in a horizontal direction, that is, a difference between outer and inner diameters of the insulating ring; the term of "thickness of an upper step surface of a lining member" refers to a width of the upper step surface of the lining member in a horizontal direction, that is, a difference between outer and inner diameters of the upper step surface.

Figure 3:
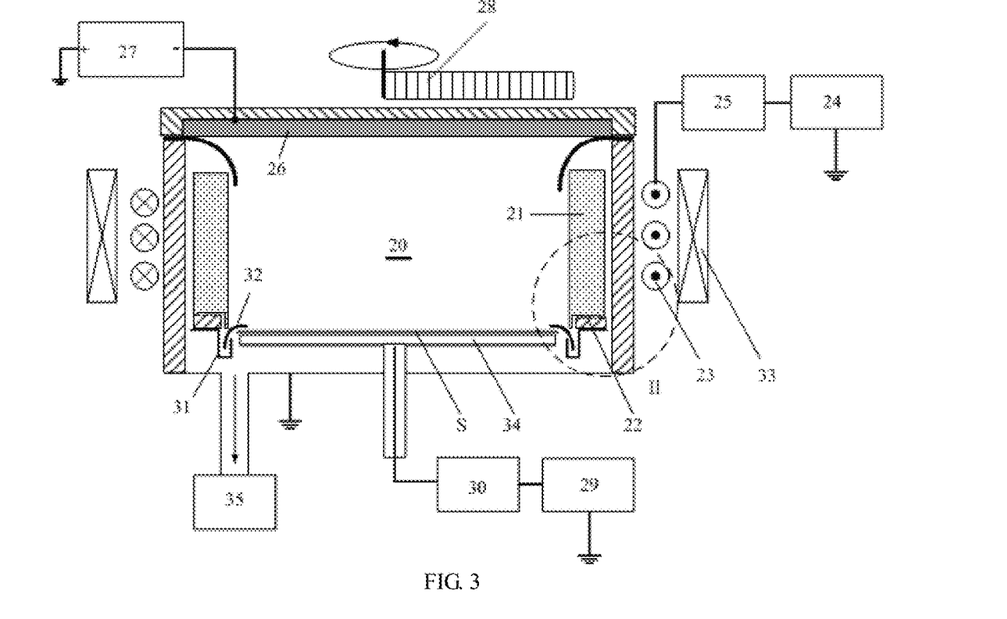
FIG. 3 is a structural schematic diagram of a reaction chamber provided in a first embodiment of the present invention.
Figure 4:
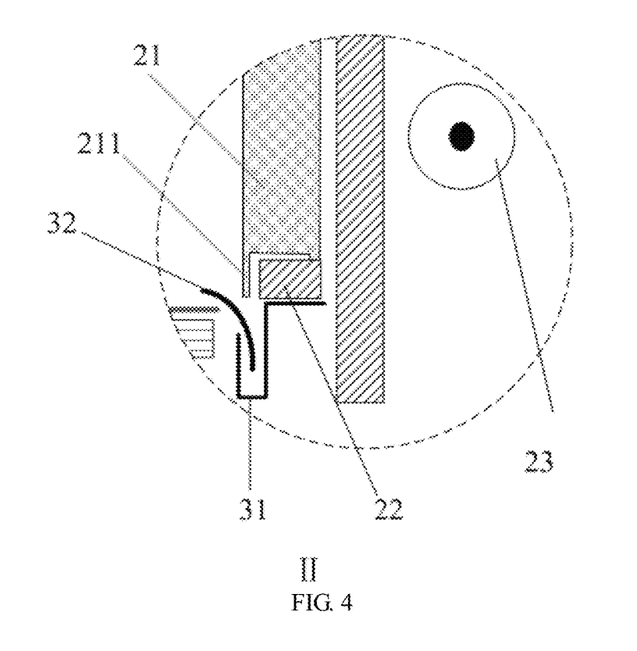
FIG. 4 is a partially enlarged view of a region II in FIG. 3.
Figure 5:
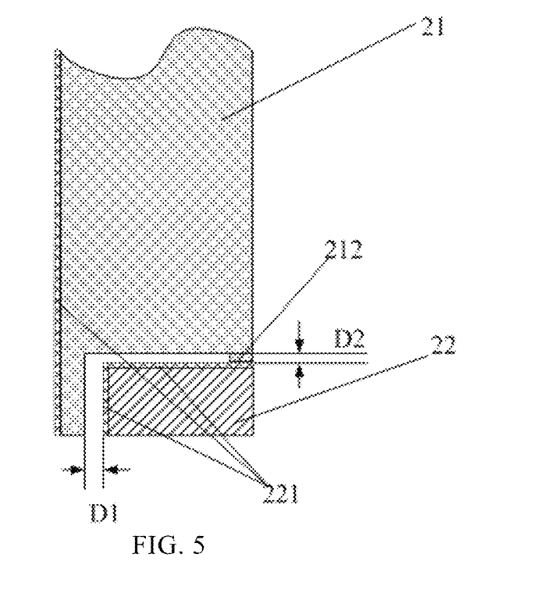
FIG. 5 is a structural schematic diagram of an insulating ring and a Faraday shielding ring in FIG. 3.

FIG. 3 is a structural schematic diagram of a reaction chamber provided in a first embodiment of the present invention; FIG. 4 is a partially enlarged view of a region II in FIG. 3; and FIG. 5 is a structural schematic diagram of an insulating ring and a Faraday shielding ring in FIG. 3. Referring to FIG. 3, FIG. 4 and FIG. 5, a reaction chamber 20 provided in the embodiment includes a Faraday shielding ring 21, an insulating ring 22, an induction coil 23, a RF power supply 24, a first impendence matcher 25, a direct current (DC) power supply 27, a magnetron 28, a bias RF power supply 29, a second impendence matcher 30, a lining member 31, a quartz ring 32, an electro-magnetic adjusting device 33, a supporting device 34 and a vacuum-pumping system 35.

In the embodiment, the Faraday shielding ring 21 is made of a magnetic insulation material and provided surrounding the inner peripheral wall of the reaction chamber 20. The Faraday shielding ring 21 is provided with at least one slot (not shown in the figures) thereon passing through the ring surface thereof in an axial direction, that is, the Faraday shielding ring 21 appears as an unclosed cylindrical structure. Preferably, a width of the slot is smaller than mean free path of a metal particle in the reaction chamber 20, so as to prevent metal particles from going to the outside of the Faraday shielding ring 21 through the slot. The so-called width of the slot refers to a gap width of the slot in the circumferential direction.

The insulating ring 22 is made of an insulating material such as quartz or ceramic and provided in the reaction chamber 20 surrounding the inner peripheral wall of the reaction chamber 20. The Faraday shielding ring 21 is stacked on the insulating ring in a vertical direction.

A shielding ring 211 is provided surrounding the inner peripheral wall of the insulating ring 22. The shielding ring 211 is connected with an area of the lower surface of the Faraday shielding ring 21 adjacent to the center of the reaction chamber 20. The shielding ring 211 is made of a magnetic insulation material and provided with at least one slot thereon passing through the ring surface thereof in an axial direction, such that the shielding ring 211 is of an unclosed cylindrical structure, thereby preventing metal particles deposited on the inner peripheral wall of the shielding ring 211 from forming a loop. Moreover, there is a horizontal spacing D1 in a horizontal direction between the outer peripheral wall of the shielding ring 211 and the inner peripheral wall of the insulating ring 22. In this way, even when metal particles pass through the slot of the shielding ring 211, the metal particles have to pass across the horizontal spacing D1 in the horizontal direction to arrive at and be deposit on the inner peripheral wall of the insulating ring 22, so that the deposition of the metal particles on the inner peripheral wall of the insulating ring 22 is further reduced. Obviously, in a case where the wall thickness of the shielding ring 211 is sufficiently large, e.g., the thickness thereof is larger than D1, even when metal particles enter the slot of the shielding ring 211, the metal particles have to pass across D1 in the horizontal direction to arrive at and be deposited on the inner peripheral wall of the insulating ring 22, so that the deposition of the metal particles on the inner peripheral wall of the insulating ring 22 is also reduced.

From above it can be seen that, the shielding ring 211 is provided surrounding the inner side of the inner peripheral wall of the insulating ring 22, extends downwards from the lower surface of the Faraday shielding ring 21, and covers the inner peripheral wall of the insulating ring 22, thereby covering the inner peripheral wall of the insulating ring 22. In this way, when metal particles move downwards in the reaction chamber 20, the metal particles will be deposited on the shielding ring 211, thereby largely reducing or even avoiding the deposition of the metal particles on the insulating ring 22. Moreover, when the gas is discharged out of the reaction chamber from up to down, a majority of metal particles will move downwards in a vertical direction due to the fact that the surfaces of the Faraday shielding ring 21 and the shielding ring 211 exposed to the interior of the reaction chamber 20 are vertical planes rather than horizontal planes, that is, a movement direction of the majority of metal particles is parallel with the inner peripheral walls of the Faraday shielding ring 21 and the shielding ring 211 facing the processing environment in the reaction chamber, causing that the metal particles are unlikely to be deposited on the Faraday shielding ring 21 and the shielding ring 211. In this way, the Faraday shielding ring 21 and the shielding ring 211 are prevented from being closed at the slotted positions, the risk of sparking is reduced, and thus the processing stability and the processing quality are improved; moreover, the pollution of the reaction chamber 20 caused by the flaking off of metal particles is reduced as the deposition of the metal particles is reduced, thereby it is possible to reduce damages on a work piece such as a substrate.

Further, in this embodiment, the deposition of metal particles is reduced and the Faraday shielding ring 21 is prevented from being closed by providing the shielding ring 211, and it is not necessary to provide a recess on the Faraday shielding ring for preventing the Faraday shielding ring from being closed as in the prior art. Accordingly, it is not necessary to set the thickness of the Faraday shielding ring 21 to be relatively large in this embodiment, that is, it is not necessary to set the thickness of the Faraday shielding ring 21 in its radial direction to be relatively large. In this way, the inner diameter of the reaction chamber is increased, and the available space of the reaction chamber is increased accordingly, thereby improving processing results compared to the prior art.

In this embodiment, the shielding ring 211 and the Faraday shielding ring 21 are integrally formed, that is, they are of an integral structure. In this case, the Faraday shielding ring 21 and the shielding ring 211 are made of a same magnetic insulation material. In practical applications, the shielding ring 211 and the Faraday shielding ring 21 may be separate structures and fixed with each other in use. In this case, it is not limited whether or not the Faraday shielding ring 21 and the shielding ring 211 are made of a same magnetic insulation material.

Preferably, a projection of the slot of the shielding ring 211 coincides with a projection of the slot of the Faraday shielding ring 21 on a plane perpendicular to a central axis of the reaction chamber 20, that is, the slot of the shielding ring 211 and the slot of the Faraday shielding ring 21 are interconnected in a vertical direction. As such, when the shielding ring 211 and the Faraday shielding ring 21 are stacked together, neither the slot of the shielding ring 211 nor the slot of the Faraday shielding ring 21 has a plane capable of supporting metal particles passing thereto in a horizontal direction (i.e., a deposition surface in a horizontal direction does not exist). Therefore, it is beneficial to further reduce the deposition of metal particles by interconnecting the slot of the shielding ring 211 and the slot of the Faraday shielding ring 21 in the vertical direction.

Preferably, the shielding ring 211 and the Faraday shielding ring 21 are coaxially provided and the inner diameters thereof are identical. As such, when the shielding ring 211 and the Faraday shielding ring 21 are stacked together, there is no misalignment between the inner peripheral walls thereof in a horizontal direction, that is, stacked surfaces thereof will not form a deposition surface for metal particles. Therefore, it is beneficial to further reduce the deposition of metal particles.

Preferably, the horizontal spacing D1 is ranged from 1 mm to 2 mm. As such, it is possible to reduce difficulty of machining process, and it is possible to avoid a problem in which metal particles deposited on the inner peripheral wall of the insulating ring 22 block the slot of the shielding ring 211 and cause the shielding ring 211 to be closed, due to that the horizontal spacing is too small. Therefore, it is possible to further reduce the risk of sparking and improve the processing stability and the processing quality.

In this embodiment, referring to FIG. 5, it is preferable that the lower surface of the Faraday shielding ring 21 is a non-flush surface, that is, an edge area of the lower surface of the Faraday shielding ring 21 distal to the center of the reaction chamber 20 appears as a protrusion 212 extending downwards with respect to the other areas. The protrusion 212 contacts the insulating ring 22 so that the Faraday shielding ring 21 is stacked on the insulating ring 22. A height of the protrusion 212 is D2, and there is a vertical spacing in a vertical direction, which is equal to the height D2, between the lower surface of the Faraday shielding ring 21 and the upper surface of the insulating ring 22 by means of the protrusion 212. It should be understood that, when the lower surface of the Faraday shielding ring 21 is not provided with the protrusion 212 and thus forms a flush surface, the lower surface of the Faraday shielding ring 21 is directly stacked on the upper surface of the insulating ring 22, and in this case, metal particles deposited on upper end of the inner peripheral wall of the insulating ring 22 are likely to connect the lower surface of the Faraday shielding ring 21 and the inner peripheral wall of the insulating ring 22 at contact positions therebetween, so that the slot of the Faraday shielding ring 21 and/or the slot of the shielding ring 211 are closed. Accordingly, by providing the protrusion 212 on the lower surface of the Faraday shielding ring 21, it is possible to further prevent the slot of the Faraday shielding ring 21 and/or the slot of the shielding ring 211 from being closed, so that the risk of sparking is further reduced and the processing stability and the processing quality are further improved. In practical applications, the vertical spacing D2 is around 1 mm.

Referring to FIG. 5, the upper surface and/or the inner peripheral wall of the insulating ring 22 are treated by a roughening process such as abrasive blasting, such that the upper surface and/or the inner peripheral wall of the insulating ring 22 are formed as a rough surface 221. The rough surface 221 can reduce stress of a metal film deposited thereon and enhance adsorption force on metal particles, such that the metal particles are unlikely to flake off. Thus, in a case where metal particles pass across the horizontal spacing D1 and/or the vertical spacing D2 and then are deposited on the inner peripheral wall and/or the upper surface of the insulating ring 22, it is possible to further reduce the flaking off of the metal particles and the thus caused pollution of the reaction chamber 20 by means of the rough surface 221, which in turn further reduces damages on a work piece. Similarly, the inner peripheral wall of the Faraday shielding ring 21 and/or the inner peripheral wall of the shielding ring 211 are preferably treated by a roughening process, such that the inner peripheral wall of the Faraday shielding ring 21 and/or the inner peripheral wall of the shielding ring 211 are formed as the rough surface 221.

Referring to FIGS. 3 and 4, the lining member 31 is provided surrounding the inner peripheral wall of the reaction chamber 20 and located at the bottom area of the reaction chamber 20. The lining member 31 is configured to cover the inner peripheral wall of the reaction chamber 20, so as to keep the reaction chamber 20 clean. The lining member 31 is generally made of a metal material and grounded. The outer diameter of the shielding ring 211 is smaller than the inner diameter of the upper step surface of the lining member 31. Preferably, the lower surface of the shielding ring 211 and the lower surface of the insulating ring 22 are in a same horizontal plane, such that the shielding ring 211 completely covers the insulating ring 22 in a vertical direction, thereby preventing metal particles from entering, from the underneath of the lower surface of the shielding ring 211, the horizontal spacing D1 and being deposited on the inner peripheral wall of the insulating ring 22, which in turn prevents the shielding ring 211 from being closed in a circumferential direction due to the blockage of the slot thereof by metal particles.

The supporting device 34 is provided at the bottom area in the reaction chamber 20 and electrically connected with the bias RF power supply 29 via the second impendence matcher 30, so that the supporting device 34 is provided with a negative bias to enhance the directivity of the metal particles, that is, metal particles in the reaction chamber 20 are vertically attracted onto the upper surface of the work piece S. As such, a metal film can be easily deposited even in a via or trench having a large depth. In this embodiment, the frequency of the bias RF power supply 29 is generally set to be 13.56 MHz.

To cover the inner peripheral wall of the reaction chamber 20 more effectively, a quartz ring 32 is provided between a recess of the lining member and the supporting device 34. A longitudinal section of the quartz ring 32 is of an arc shape, and an upper end thereof is adjacent to the center of the chamber and a lower end thereof is distal to the center of the chamber and positioned in the recess of the lining member. The position of the quartz ring 32 may be switched between an operating position and a non-operating position. Specifically, when a work piece S is supported by the supporting device 34 for processing, the quartz ring 32 is in the operating position, and the upper end thereof contacts an edge area of the upper surface of the work piece S and firmly presses the work piece S on the supporting device 34; and when the supporting device 34 moves down to a non-processing position, the quartz ring 32 is in the non-operating position, the upper end thereof does not contact the supporting device 34 and the lower end thereof falls down to be supported on the bottom of the recess of the lining member. By providing the quartz ring 32, it is possible to prevent metal particles from being diffused from a gap between the lining member 31 and the supporting device 34 to a space between the supporting device 34 and the inner peripheral wall of the reaction chamber 20, which in turn prevents the inner peripheral wall of the reaction chamber 20 from being polluted by metal particles.

The vacuum-pumping system 35 is provided at the bottom of the reaction chamber 20, and is configured to discharge a gas out of the reaction chamber from up to down, so as to maintain the vacuum environment in the reaction chamber 20 and ensure the processing stability.

In this embodiment, a target material 26 made of a metal material is provided at the top of the reaction chamber 20 and electrically connected with the DC power supply 27 provided at exterior of the reaction chamber 20 so as to excite a processing gas in the reaction chamber 20 to form plasma. The DC power supply 27 supplies a negative bias to the target material 26, so that positive ions of the plasma are attracted by the negative bias to bombard a surface of the target material 26, causing that metal atoms escape from the surface of the target material 26 and are deposited on the upper surface of the work piece S to form a metal film on the upper surface of the work piece S.

The magnetron 28, which is capable of rotating in a horizontal plane around the central axis of the reaction chamber 20, is provided above the top of the reaction chamber 20. The magnetron 28 is configured to be rotatable to ensure that the whole target material 26 can be bombarded, thereby ensuring uniformities of the bombardment and usage of the target material 26. As such, utilization ratio of the target material 26 is increased, in addition to enhancement of the concentration of the plasma due to the increase of bombarded area on the target 26.

The induction coil 23 is nested at outer side of the reaction chamber 20 and electrically connected with the RF power supply 24 via the first impendence matcher 25, and is configured to excite the processing gas in the reaction chamber 20 to form plasma when the RF power supply 24 is turned on, that is, the energy of the RF power supply is coupled into the reaction chamber 20, so that the ion concentration of the plasma in the reaction chamber 20 is further increased. The frequency of the RF power supply 24 is ranged from 0.1 MHz to 60 MHz, and preferably, the frequency of the RF power supply 24 is 2 MHz.

The electro-magnetic adjusting device 33 including one or more groups of electromagnets is provided at outer side of the induction coil 23 and configured to adjust a distribution of the plasma in the reaction chamber 20, so as to improve the processing quality.

It should be noted that, although the outer diameter of the shielding ring 211 is smaller than the inner diameter of the upper step surface of the lining member 31, and the lower surface of the shielding ring 211 and the lower surface of the insulating ring 22 are in a same horizontal plane in this embodiment; but the present invention is not limited thereto. In practical applications, the lower surface of the shielding ring 211 may be higher or lower than the lower surface of the insulating ring 22, and the specific arrangement may be set according to actual needs. For example, as the quartz ring 32 is provided right below the lower surface of the shielding ring 211 in this embodiment, the lower surface of the shielding ring 211 is unable to extend to the underneath of the lower surface of the insulating ring 22. That is, in the case where the quartz ring 32 is provided right below the lower surface of the shielding ring 211, the lower surface of the shielding ring 211 may be positioned above the lower surface of the insulating ring 22 or may be on the same horizontal plane as the lower surface of the insulating ring 22.

Figure 6:
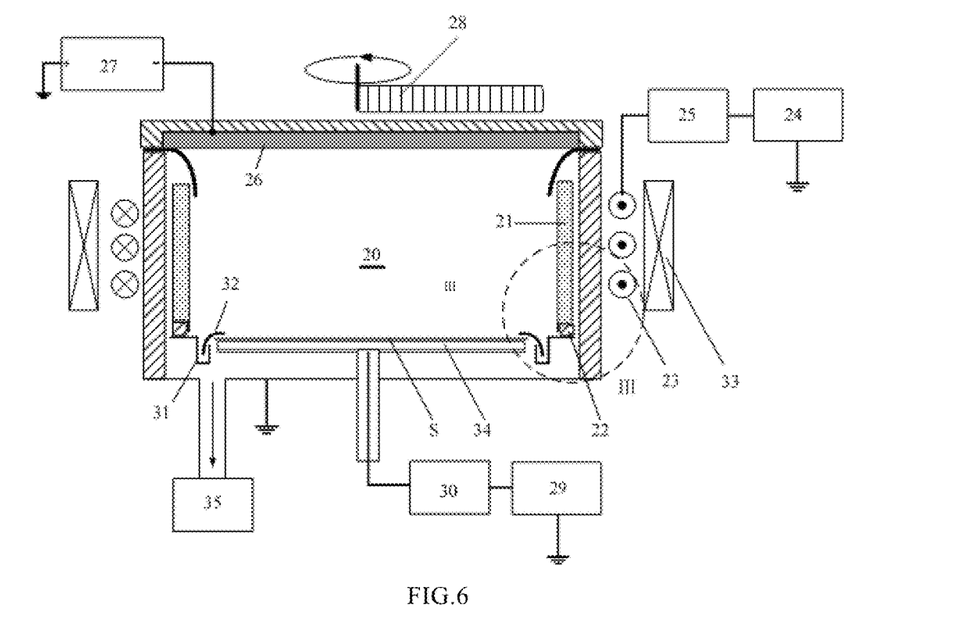
FIG. 6 is a structural schematic diagram of a reaction chamber provided in a second embodiment of the present invention.
Figure 7:
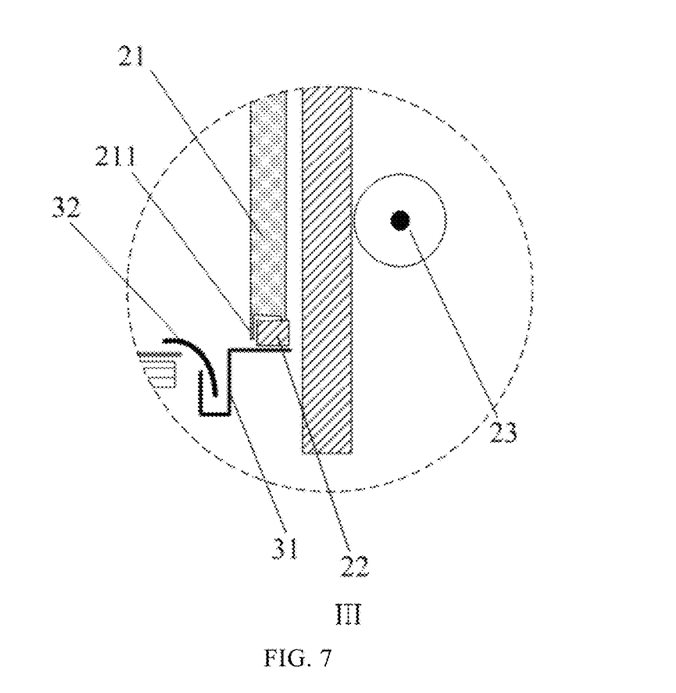
FIG. 7 is a partially enlarged view of a region III in FIG. 6.
Figure 8:
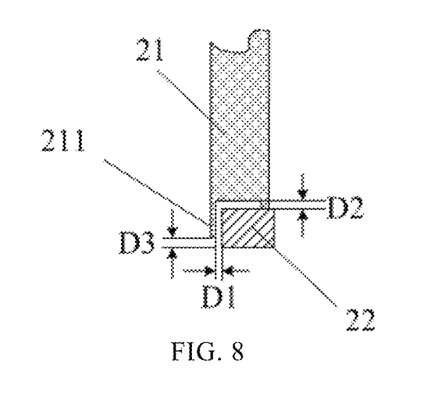
FIG. 8 is a structural schematic diagram of an insulating ring and a Faraday shielding ring in FIG. 6.

Referring to FIGS. 6 to 8, FIG. 6 is a structural schematic diagram of a reaction chamber provided in a second embodiment of the present invention; FIG. 7 is a partially enlarged view of a region III in FIG. 6; and FIG. 8 is a structural schematic diagram of an insulating ring and a Faraday shielding ring in FIG. 6. Compared to the first embodiment, in the reaction chamber 20 provided in the second embodiment, the thicknesses of the Faraday shielding ring 21 and the insulating ring 22 both become thinner, while the thickness of the upper step surface of the lining member 31 remains unchanged. In this case, the inner diameter of the shielding ring 211 is larger than that of the upper step surface of the lining member 31, and there is a vertical spacing D3 in a vertical direction between the lower surface of the shielding ring 211 and the lower surface of the insulating ring 22 (or the upper step surface of the lining member 31), as shown in FIG. 8, so as to ensure that the shielding ring 211 does not contact the lining member 31. In this embodiment, the vertical spacing D3 is about 5 mm.

The reason of providing the vertical spacing D3 is that, in a case where the inner diameter of the shielding ring 211 is larger than that of the upper step surface of the lining member 31, if the lower surface of the shielding ring 211 and the lower surface of the insulating ring 22 are still in a same plane, then, when the insulating ring 22 is stacked on the upper step surface of the lining member 31, the lower surface of the shielding ring 211 also contacts the upper step surface of the lining member 31 so that the shielding ring 211 is stacked thereon, and in this case, as the lining member 31 is made of a metal material and metal particles are deposited on the upper step surface of the lining member 31 in a process, the shielding ring 211 may be closed at its slotted position due to these two factors. Thus, in this case, in order to prevent the shielding ring 211 from being closed at its slotted position, the lower surface of the shielding ring 211 is required to be higher than the lower surface of the insulating ring 22, and a distance D3 in a vertical direction is required therebetween. As the existence of the vertical spacing D3, the shielding ring 211 and the lining member 31 will not contact each other. In this case, even when metal particles are deposited on the upper step surface of the lining member 31 as proceeding of a process, the shielding ring 211 is unlikely to be closed at its slotted position, let alone the lining member 31 is cleaned frequently and exchanged. Therefore, the thus designed reaction chamber 20 can satisfy process requirements.

It can be understood that, as each of the thicknesses of the shielding ring 22 and the Faraday shielding ring 21 may be smaller than the thickness of the upper step surface of the lining member 31 (that is, both orthogonal projections of the inner peripheral walls of the insulating ring 22 and the Faraday shielding ring 21 on a plane where the upper step surface of the lining member 31 is located are within the upper step surface of the lining member 31) in the second embodiment of the present invention, the thickness of the Faraday shielding ring 21 in a horizontal direction is not limited, as long as each of the thicknesses of the shielding ring 22 and the Faraday shielding ring 21 is smaller than the thickness of the upper step surface of the lining member 31. In other words, the thickness of the Faraday shielding ring 21 may be reduced according to actual needs, so as to increase the inner diameter and the available space of the reaction chamber 20, which in turn increases uniformity of process. In addition, as the thickness of the Faraday shielding ring 21 in the reaction chamber provided in this embodiment can be set according to actual needs, the flexibility of arrangement of the Faraday shielding ring 21 can be increased.

It should be noted that in the case where the thicknesses of the Faraday shielding ring 21 and the insulating ring 22 in the reaction chamber provided in the second embodiment of the present invention are thinner compared to those of the first embodiment, the thickness of the upper step surface of the lining member 31 may be reduced accordingly, so as to increase the available space of the reaction chamber 20; alternatively, the thickness of the upper step surface of the lining member 31 may remain unchanged, so as to efficiently use the existing lining member 31 without re-making the lining member 31, thereby avoiding increase of process cost.

In general, in the reaction chamber provided in embodiments of the present invention, the shielding ring 211 vertically extending downwards is provided in an area of the lower surface of the Faraday shielding ring 21 adjacent to the center of the reaction chamber 20, and the shielding ring 211 is also made of a magnetic insulation material and provided with a slot thereon passing through the ring surface thereof in an axial direction. The shielding ring 211 is provided surrounding the inner side of the inner peripheral wall of the insulating ring 22, so as to cover the inner peripheral wall of the insulating ring 22. In this way, when metal particles move downwards in the reaction chamber 20, the metal particles will be deposited on the shielding ring 211, thereby largely reducing or even avoiding the deposition of the metal particles on the insulating ring 22. Moreover, when the gas is discharged out of the reaction chamber from up to down, a majority of metal particles will move downwards in a vertical direction due to the fact that the surfaces of the Faraday shielding ring 21 and the shielding ring 211 exposed to the interior of the reaction chamber 20 are vertical planes rather than horizontal planes, that is, a movement direction of the majority of metal particles is parallel with the inner peripheral walls of the Faraday shielding ring 21 and the shielding ring 211 facing the center of the reaction chamber, causing that the metal particles are unlikely to be deposited on the Faraday shielding ring 21 and the shielding ring 211. In this way, not only the Faraday shielding ring 21 and the shielding ring 211 are prevented from being closed at the slotted positions, the risk of sparking is reduced, and the processing stability and the processing quality are improved, but also the pollution of the reaction chamber 20 caused by the flaking off of metal particles is reduced as the deposition of the metal particles is reduced, thereby it is possible to reduce damages on a work piece.

Further, in the case where the horizontal spacing D1 in the horizontal direction exists between the outer peripheral wall of the shielding ring 211 and the inner peripheral wall of the insulating ring 22, even when metal particles pass through the slot of the shielding ring 211, the metal particles have to pass across the horizontal spacing D1 in the horizontal direction to arrive at and be deposited on the inner peripheral wall of the insulating ring 22, so that the deposition of the metal particles on the inner peripheral wall of the insulating ring 22 is further reduced. Moreover, in the case where the thickness of the Faraday shielding ring 21 in its radial direction is reduced, the inner diameter and the available space of the reaction chamber 20 can be increased, thereby further improving uniformity of a process.

As another technical solution, the present invention further provides a semiconductor processing device comprising the reaction chamber provided in any one of the above embodiments and a magnetron sputtering apparatus.

The semiconductor processing device provided in this embodiment adopts the reaction chamber provided in the above-described embodiments of the present invention, so that the risk of sparking in the reaction chamber is reduced, and the processing stability and the processing quality are improved; and in addition, it is possible to reduce the pollution of the reaction chamber caused by the flaking off of metal particles, and reduce damages on the work piece. Moreover, by reducing the thickness of the Faraday shielding ring in its radial direction, the inner diameter and the available space of the reaction chamber are increased, thereby improving uniformity of a process.

It could be understood that the foregoing implementations are merely exemplary embodiments used for illustrating the principle of the present invention, but the present invention is not limited thereto. Various modifications and improvements may be made for those skilled in the art without departing from the principle and essence of the present invention, and these modifications and improvements are also regarded as the protection scope of the present invention.

What is claimed is:

1. A reaction chamber, comprising: a Faraday shielding ring made of a magnetic insulation material and an insulating ring made of an insulating material, the Faraday shielding ring being provided with a slot thereon passing through a ring surface thereof in an axial direction, both the Faraday shielding ring and the insulating ring being disposed in the reaction chamber surrounding an inner peripheral wall of the reaction chamber, and the Faraday shielding ring being stacked on the insulating ring in a vertical direction, wherein, a shielding ring is disposed surrounding an inner peripheral wall of the insulating ring, the shielding ring is connected to an area of a lower surface of the Faraday shielding ring adjacent to a center of the reaction chamber, and the shielding ring is made of a magnetic insulation material and provided with a slot thereon passing through a ring surface of the shielding ring in an axis direction.

2. The reaction chamber according to claim 1, wherein a projection of the slot of the shielding ring coincides with a projection of the slot of the Faraday shielding ring on a plane perpendicular to a central axis of the reaction chamber.

3. The reaction chamber according to claim 1, wherein the shielding ring and the Faraday shielding ring are coaxially disposed and inner diameters of the shielding ring and the Faraday shielding ring are identical.

4. The reaction chamber according to claim 1, wherein a horizontal spacing in a horizontal direction exists between an outer peripheral wall of the shielding ring and the inner peripheral wall of the insulating ring.

5. The reaction chamber according to claim 4, wherein the horizontal spacing is ranged from 1 mm to 2 mm.

6. The reaction chamber according to claim 1, wherein an edge area of the lower surface of the Faraday shielding ring distal to the center of the reaction chamber is provided with a protrusion protruding downwards and the protrusion contacts an upper surface of the insulating ring, such that the Faraday shielding ring is stacked on the upper surface of the insulating ring.

7. The reaction chamber according to claim 1, wherein the upper surface and/or the inner peripheral wall of the insulating ring and/or an inner peripheral wall of the Faraday shielding ring and/or an inner peripheral wall of the shielding ring are treated by a roughening process.

8. The reaction chamber according to claim 1, further comprising a lining member which is disposed surrounding the inner peripheral wall of the reaction chamber at a bottom area of the reaction chamber, wherein a longitudinal section of the lining member is of a stepped shape, and the insulating ring is stacked on an upper step surface of the lining member.

9. The reaction chamber according to claim 8, wherein an inner diameter of the shielding ring is larger than an inner diameter of the upper step surface of the lining member, and a lower surface of the shielding ring is higher than a lower surface of the insulating ring, such that the shielding ring does not contact the upper step surface of the lining member.

10. The reaction chamber according to claim 8, wherein an outer diameter of the shielding ring is smaller than an inner diameter of the upper step surface of the lining member, and a lower surface of the shielding ring and a lower surface of the insulating ring are in a same horizontal plane.

11. The reaction chamber according to claim 1, wherein the shielding ring and the Faraday shielding ring are integrally formed.

12. A semiconductor processing device, comprising the reaction chamber according to claim 1.

* * * * *